(12) United States Patent
Klein et al.

(10) Patent No.: US 8,018,250 B1
(45) Date of Patent: Sep. 13, 2011

(54) INPUT/OUTPUT BLOCK AND OPERATION THEREOF

(75) Inventors: Matthew H. Klein, Redwood City, CA (US); Jian Tan, Fremont, CA (US); Ketan Sodha, Fremont, CA (US); Madan M. Patra, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/907,850

(22) Filed: Oct. 19, 2010

(51) Int. Cl.
*H03K 19/00* (2006.01)
*H03K 19/02* (2006.01)

(52) U.S. Cl. .............. 326/56; 326/30; 710/302; 710/304

(58) Field of Classification Search .................... 326/30, 326/56; 710/302, 304
See application file for complete search history.

(56) References Cited

U.S. PATENT DOCUMENTS

| | | | | |
|---|---|---|---|---|
| 4,608,504 A * | 8/1986 | Yamamoto | ...................... | 326/86 |
| 5,214,330 A * | 5/1993 | Okazaki | ........................... | 326/90 |
| 5,467,455 A * | 11/1995 | Gay et al. | ...................... | 710/100 |
| 5,736,890 A * | 4/1998 | Yee et al. | ...................... | 327/423 |
| 5,821,798 A * | 10/1998 | Tonn, Jr. | ......................... | 327/333 |
| 6,172,518 B1 | 1/2001 | Jenkins, IV et al. | | |
| 6,359,471 B1 * | 3/2002 | Mueller et al. | .................. | 326/81 |
| 6,445,245 B1 | 9/2002 | Schultz et al. | | |
| 6,489,837 B2 | 12/2002 | Schultz et al. | | |
| 6,834,318 B2 * | 12/2004 | Hunter et al. | ................. | 710/110 |
| 6,941,402 B2 * | 9/2005 | Tashiro | ........................ | 710/301 |
| 7,061,274 B2 * | 6/2006 | George | ........................... | 326/86 |
| 7,348,803 B2 * | 3/2008 | Bui et al. | ......................... | 326/82 |
| 7,583,102 B1 * | 9/2009 | Simmons et al. | ................ | 326/38 |
| 7,692,450 B2 * | 4/2010 | Aranovsky | ...................... | 326/82 |
| 7,882,279 B2 * | 2/2011 | Takehara | ........................ | 710/31 |
| 2007/0055795 A1 * | 3/2007 | Seo et al. | ......................... | 710/15 |
| 2007/0080716 A1 * | 4/2007 | Strangfeld et al. | .............. | 326/83 |
| 2008/0272800 A1 * | 11/2008 | Haig et al. | ....................... | 326/30 |

OTHER PUBLICATIONS

Xilinx, Inc., *CPDL Schematic Design Guide*, Appendix A, online manual downloaded Oct. 15, 2010 from http://www.xilinx.com/itp/3_1i/data/alliance/csd/csd.htm, pp. 1-15, Xilinx, Inc., San Jose, California, USA.

Xilinx, Inc., *Synplify—How do I selectively disable IBUF/OBUF insertion using ".ispad" or "black box pad pin"?*38, AR #4508, Sep. 17, 2003, downloaded Oct. 15, 2010 from http://www.xilinx.com/support/answer/4508.htm, pp. 1-5, Xilinx, Inc., San Jose, California, USA.

Xilinx, Inc., IBUF, 4, 8, 16,' *Libraries Guide, ISE 5,2i*, Design Elements section, Mar. 3, 2003, online manual downloaded Oct. 15, 2010 from http://www.xilinx.com/itp/xilinx5/data/docs/lib/lib0230_214.html, pp. 1-3, Xilinx, Inc., San Jose, California, USA.

Xilinx, Inc., *Virtex-6 FPGA SelectIO Resources*, UG361 (v1.3), Aug. 16, 2010, pp. 1-162, Xilinx, Inc., San Jose, California, USA.

(Continued)

*Primary Examiner* — Jason M Crawford
(74) *Attorney, Agent, or Firm* — W. Eric Webostad; LeRoy D. Maunu (57) ABSTRACT

An embodiment of a method for operation of an input/output block is disclosed. For this embodiment of the method, a first attribute is set for a first disable signal for an input driver. A first tri-state condition is removed from an output driver. In response to the removing of the first tri-state condition, the input driver is placed in a second tri-state condition.

15 Claims, 10 Drawing Sheets

OTHER PUBLICATIONS

Xilinx, Inc., *Utility Differential Signaling Buffer (v1.01a)*, DS647, Sep. 16, 2009, pp. 1-4, Xilinx, Inc., San Jose, California, USA.

Xilinx, Inc., *Using DataGATE in CoolRunner-II CPLDs*, XAPP395 (v1.2), Sep. 22, 2003, pp. 1-9, Xilinx, Inc., San Jose, California, USA.

Xilinix, Inc., *Xilinx FPGAs: A Technical Overview for the First-Time User*, XAPP097 (v1.3), Dec. 12, 1998, pp. 1-2, Xilinx, Inc., San Jose, California, USA.

Xilinx, Inc., *Managing Power with CoolRubber-II CPLDs*, XAPP436 (v1.2), Sep. 28, 2005, pp. 1-10, Xilinx, Inc., San Jose, California, USA.

Xilinx, Inc., *Managing Power in FPGAs and Other Devices Using CoolRunner-II CPLDs*, XAPP436 (v2.0), Jun. 5, 2008, pp. 1-9, Xilinx, Inc., San Jose, California, USA.

Xilinx, Inc., *XC3000 Series Field Programmable Gate Arrays (XC3000A/L, XC3100A/L)* Version 3.1, Nov. 9, 1998, pp. 1-76, Xilinx, Inc., San Jose, California, USA.

\* cited by examiner

| IBUF_DISABLE 320 | TRISTATE 311 | TRISTATE 333 | Vref-Based/Differential IBUF 410 |
| --- | --- | --- | --- |
| 0 | 0 | 1 | DISABLE |
| 0 | 1 | 0 | ENABLE |
| 1 | 0 | 1 | DISABLE |
| 1 | 1 | 1 | DISABLE |

INPUT/OUTPUT BLOCK AND OPERATION THEREOF

FIELD OF THE INVENTION

An embodiment of the invention relates to integrated circuit devices ("ICs"). More particularly, an embodiment of the invention relates to an input/output block for an IC.

BACKGROUND

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Integrated circuits have become more "dense" over time, i.e., more logic features have been implemented in an IC of a given size. Therefore, power consumption has become an increasingly more significant issue. Hence, it is desirable to provide an IC having reduced power consumption.

SUMMARY

One or more embodiments generally relate to an input/output block for an IC.

An embodiment relates generally to an input/output block. In such an embodiment, an output driver has a first control port for receiving a first tri-state signal. An input driver has a second control port. Control circuitry is coupled to receive the first tri-state signal and is coupled to the second control port. The control circuitry provides a second tri-state signal responsive to control signaling. The input driver is coupled to receive the second tri-state signal. An input/output node is commonly coupled to an output port of the output driver and an input port of the input driver. Responsive to the control signaling, which includes the first tri-state signal and the second tri-state signal, the output driver is de-activated during a receive mode and activated during a send mode, and the input driver is activated during the receive mode and de-activated during the send mode.

Another embodiment relates generally to another input/output block. In such an embodiment, an input driver and an output driver are included, where the output driver has a first control port for receiving a tri-state signal. An input/output node is commonly coupled to an output port of the output driver and an input port of the input driver. A programmable termination impedance circuit is coupled to the input/output node. The programmable termination impedance circuit includes control circuitry coupled to receive the tri-state signal and a disable signal. The control circuitry is configured to: activate the programmable termination impedance circuit for a receive mode responsive to the tri-state signal; and deactivate the programmable termination impedance circuit for a send mode and an idle state respectively responsive to the tri-state signal and the disable signal.

Yet another embodiment relates generally to a method for operation of an input/output block. In such an embodiment, a first attribute is set for a disable signal for an input driver. A first tri-state condition is removed from an output driver. Responsive to the removing, the input driver is placed in a second tri-state condition.

Still yet another embodiment relates generally to a method for operation of an input/output block. In such an embodiment, a first tri-state condition is removed from an output driver. Responsive to the removing, a programmable termination impedance circuit is placed in a second tri-state condition.

BRIEF DESCRIPTION OF THE DRAWINGS

Accompanying drawings show exemplary embodiments in accordance with one or more aspects of the invention; however, the accompanying drawings should not be taken to limit the invention to the embodiments shown, but are for explanation and understanding only.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Heretofore, receivers in bidirectional I/Os, such as IOBs, were active when such I/Os were used for driving output, namely in a sending state or mode. Accordingly, receivers of such I/Os consumed a significant amount of power even when such I/Os were in a sending state.

Along those lines, conventionally receivers in bidirectional I/Os were active when "off bus." By "off bus," it is generally meant an idle state of a bus with respect to a device. For example, for external memory coupled to an FPGA, there is a memory interface that includes multiple IOBs. There may be intervals of time when such an FPGA is neither writing to nor reading from such external memory; during these intervals such IOBs may be said to be "off bus," namely generally referring to an idle state of a bus or interface. Heretofore, conventionally IOBs were in an input or receiving mode when "off bus," and thus their receivers were actively consuming a significant amount of power during such "off bus" intervals of time.

Exemplary input/output circuits are now described (e.g., an IOB for a programmable IC) having reduced power consumption when in a sending mode and/or when off bus.

Figure 1:
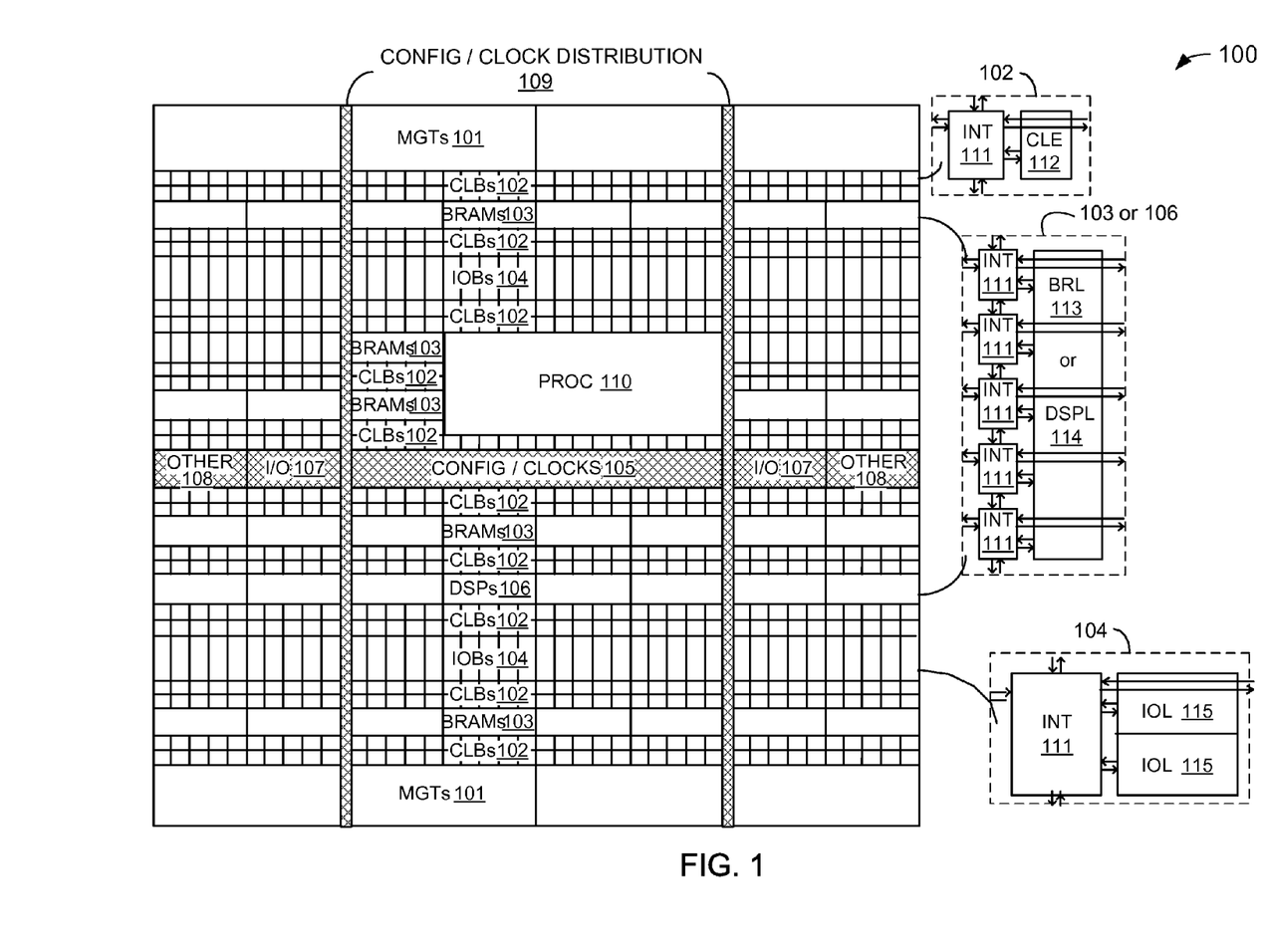
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

In the following description, IOBs having tri-state input buffers are described. Moreover, in the following description, IOBs with programmable termination impedance circuits that may be disabled are described. Even though buffers are described for drivers, it should be understood that other circuits used for buffering signals for driving an input or an output may be used. Furthermore, the terms input buffer and/or input driver are used herein to refer to an input receiver driver. However, prior to such description, FIGS. 2A through 2D are circuit diagrams of respective exemplary embodiments of IOBs, each of which may be modified to have either or both a tri-state input buffer or a programmable termination impedance circuit as later described herein. Even though FPGA IOBs are used herein as exemplary circuits for purposes of describing one or more embodiments, the circuits and methods described herein may likewise be applied to other ICs.

Figure 2A:
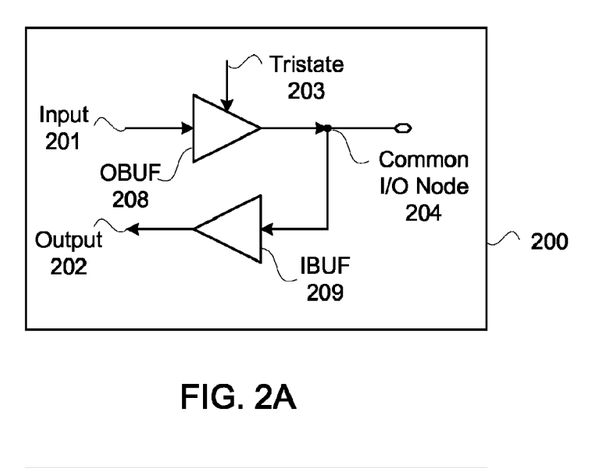
FIGS. 2A through 2D are circuit diagrams depicting respective exemplary embodiments of input/output block ("IOB") configurations.

FIG. 2A is a circuit diagram depicting an exemplary embodiment of an IOB 200. IOB 200 includes output buffer ("OBUF") 208, input buffer ("IBUF") 209, and common input/output ("I/O") node 204. Output buffer 208 is coupled to receive an input 201, such as data to be transmitted. In a send mode, a tri-state signal 203 provided to output buffer 208 is de-asserted. Thus, output buffer 208 is taken out of a tri-state mode, namely a high-impedance mode, and thus input 201 is output from output buffer 208 to common I/O node 204 for transmission.

In a receive mode, input buffer 209 receives information, such as data, via common I/O node 204 as an input. Input buffer 209 provides such received information as output 202. It should be understood that heretofore input buffer 209 was not a tri-state buffer. In other words, output buffer 208 was a tri-state output buffer and input buffer 209 was not a tri-state input buffer.

It should be understood that a buffer consumes less power when in a tri-state condition than when in an operative condition. Thus, heretofore input buffer 209 consumed more power than output buffer 208 when tri-stated.

Figure 2B:
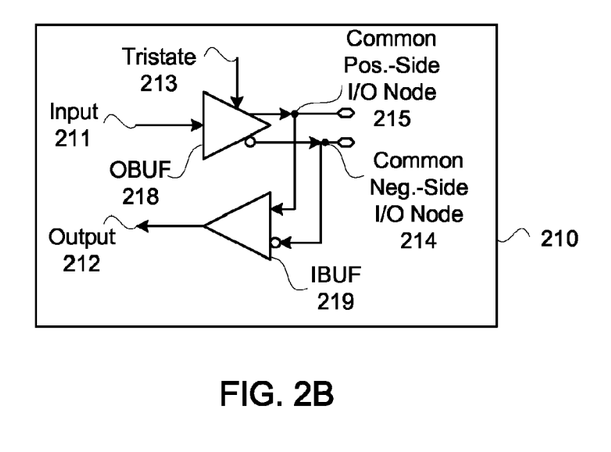

FIG. 2B is a circuit diagram depicting an exemplary embodiment of an IOB 210. Where IOB 200 of FIG. 2A is for single-ended signaling, IOB 210 of FIG. 2B is for differential signaling.

IOB 210 includes a tri-state differential output buffer 218 and a differential input buffer 219, as well as a common plus or positive-side I/O node 215 and a common minus or negative-side I/O node 214. Input 211 is provided to output buffer 218. Output buffer 218 receives a control signal, namely tri-state signal 213. When tri-state signal 213 is asserted, output buffer 218 is in a tri-state condition. However, in a send mode, tri-state signal 213 is de-asserted allowing input 211 to be buffered by output buffer 218 for output via differential outputs of output buffer 218. More particularly, a positive side output of differential output buffer 218 is provided to common positive-side I/O node 215, and an inverted or negative side output of differential output buffer 218 is provided to common negative-side I/O node 214.

Common positive-side I/O node 215 is coupled to a plus or positive-side input of differential input buffer 219, and common negative-side I/O node 214 is coupled to a minus, negative or inverted side input of differential input buffer 219. Differential input provided to differential input buffer 219 is provided as output 212 therefrom. Heretofore, differential input buffer 219 was not tri-state buffer, in contrast to differential output buffer 218. Thus, as previously described, heretofore during a send mode, differential input buffer 219 drew power.

Figure 2C:
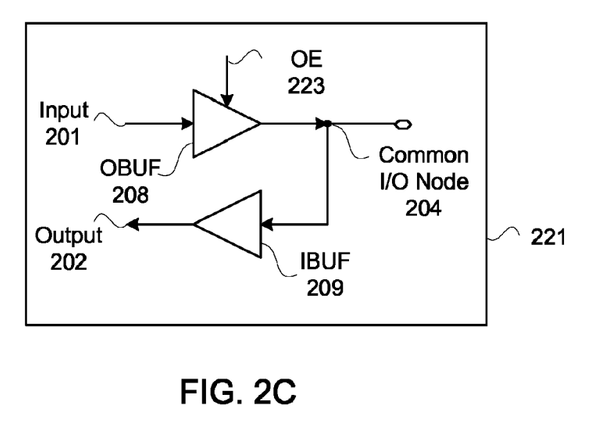

FIG. 2C is a circuit diagram depicting an exemplary embodiment of IOB 221. IOB 221 is essentially the same as IOB 200 of FIG. 2A, except rather than a tri-state signal, such as tri-state signal 203, an output enable ("OE") signal 223 is provided as a control signal to output buffer 208. For purposes of clarity by way of example and not limitation, tri-state signal 203 and output enable signal 223 are used interchangeably as described herein.

Figure 2D:
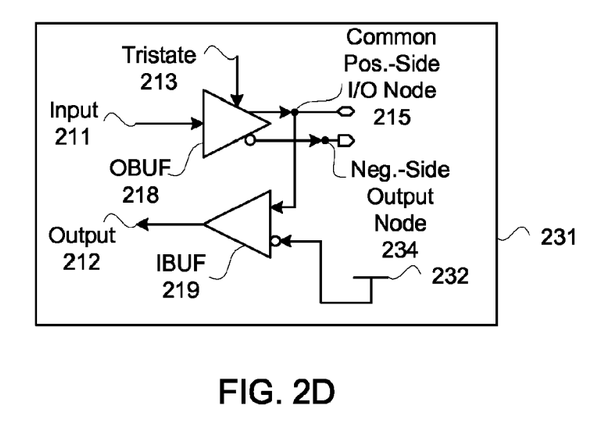

FIG. 2D is a circuit diagram depicting an exemplary embodiment of an IOB 231. IOB 231 is the same as IOB 210 of FIG. 2B, except for the following differences. Rather than having a negative-side input of differential input buffer 219 coupled to a common negative-side I/O node 214, common negative-side I/O node 214 is a negative-side output node 234. Thus, only an output pad is used for such negative-side output node 234. Moreover, differential input buffer 219 has its negative-side input coupled to a reference voltage 232, and not to a common I/O node. Thus, FIG. 2B may be thought of as a pure or true differential signaling with respect to input buffer 219, and FIG. 2D may be thought of as a reference voltage based differential signaling with respect to input buffer 219.

Figure 3A:
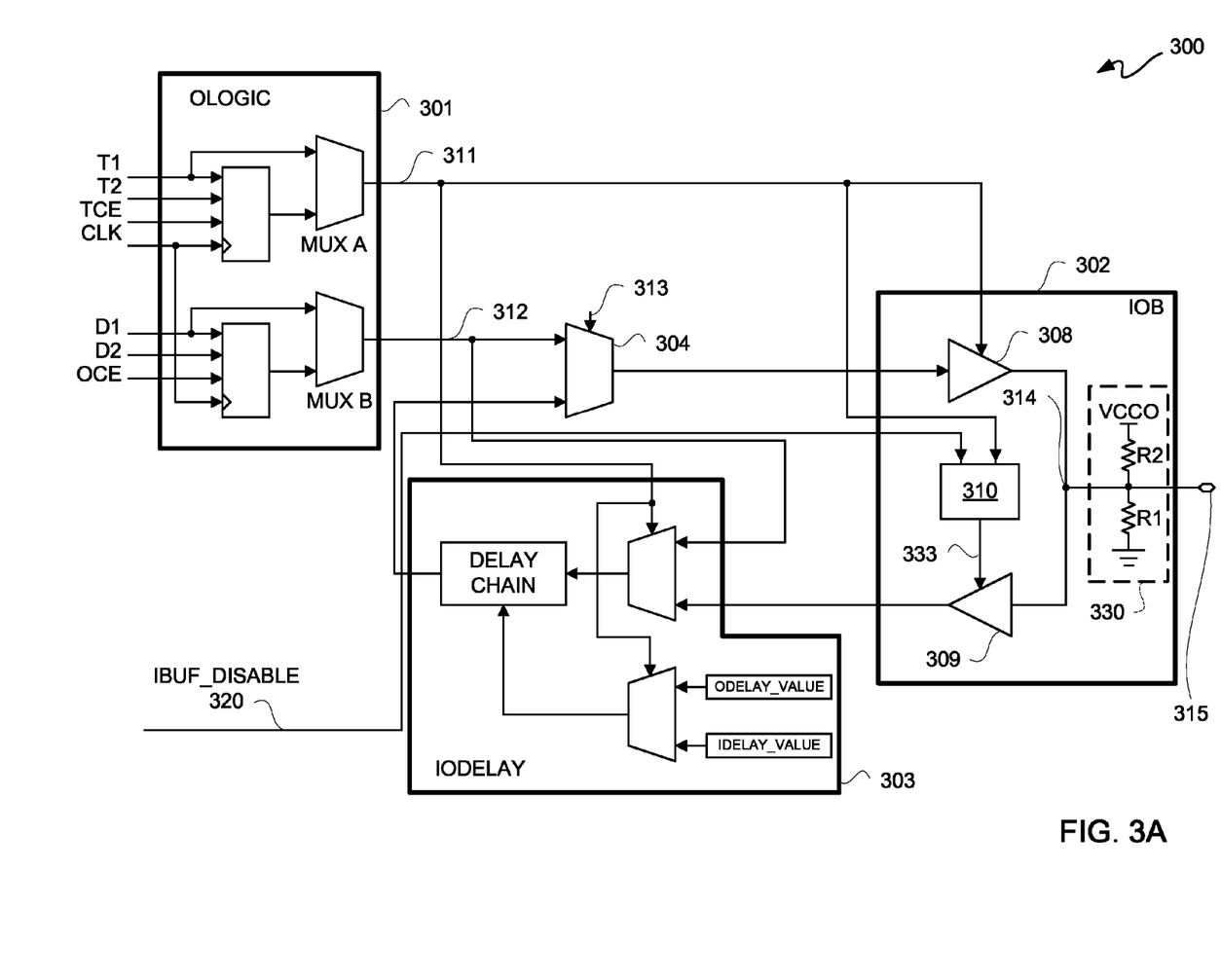
FIG. 3A is a block/circuit diagram depicting an exemplary embodiment of an I/O system.

FIG. 3A is a block/circuit diagram depicting an exemplary embodiment of an I/O system 300. I/O system 300 includes output logic 301, IOB 302, I/O delay 303, and multiplexer 304. Output logic 301 is configured to provide a tri-state output 311 and a data output 312. As output logic 301 is known, it is not described in unnecessary detail herein.

Data output 312 is provided as an input to multiplexer 304 and provided as an output data input to I/O delay 303. As I/O delay 303 is known, it is not described in unnecessary detail herein. Another input of multiplexer 304 is obtained as an output from I/O delay 303. A control select signal 313 for multiplexer 304 may be used to select between these two inputs. Output of multiplexer 304 is provided as an input to output buffer 308 of IOB 302.

IOB 302 includes output buffer 308, common I/O node 314, control circuit 310, and input buffer 309. Common I/O node 314 is connected to I/O pad 315. Optionally, IOB 302 may include a programmable termination impedance circuit 330.

Tri-state output 311 is provided as a control signal input port of output buffer 308 as well as to a control select input of I/O delay 303. Tri-state output 311 is further provided to control circuit 310 of IOB 302, and control circuit 310 provides tri-state signal 333 to a control signal port of input buffer 309. Another input to control circuit 310 of IOB 302 is input buffer disable signal 320.

Figure 3B:
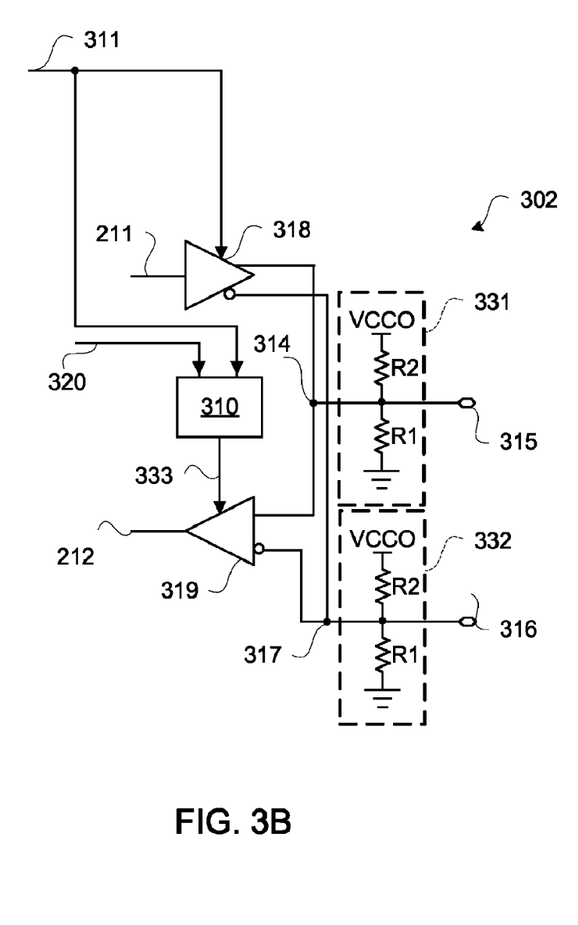
FIGS. 3B and 3C are block/circuit diagrams depicting respective exemplary embodiment of differential IOBs that may be used in the I/O system of FIG. 3A.

It should be understood that single-ended and differential buffers as described may be used in IOB 302. FIG. 3B is a block/circuit diagram depicting an exemplary embodiment of an IOB 302 with a differential tri-state output buffer 318 replacing output buffer 308 and with a differential tri-state input buffer 319 replacing input buffer 309. A positive-side output of output buffer 318 is coupled to common I/O node 314, which is coupled to a positive-side input of input buffer 319. A negative-side output of output buffer 318 is coupled to a common I/O node 317, which is coupled to a negative-side input of input buffer 319. Nodes 314 and 317 are respectively coupled to optional programmable termination impedance circuits 331 and 332 and to I/O pads 315 and 316.

Figure 3C:
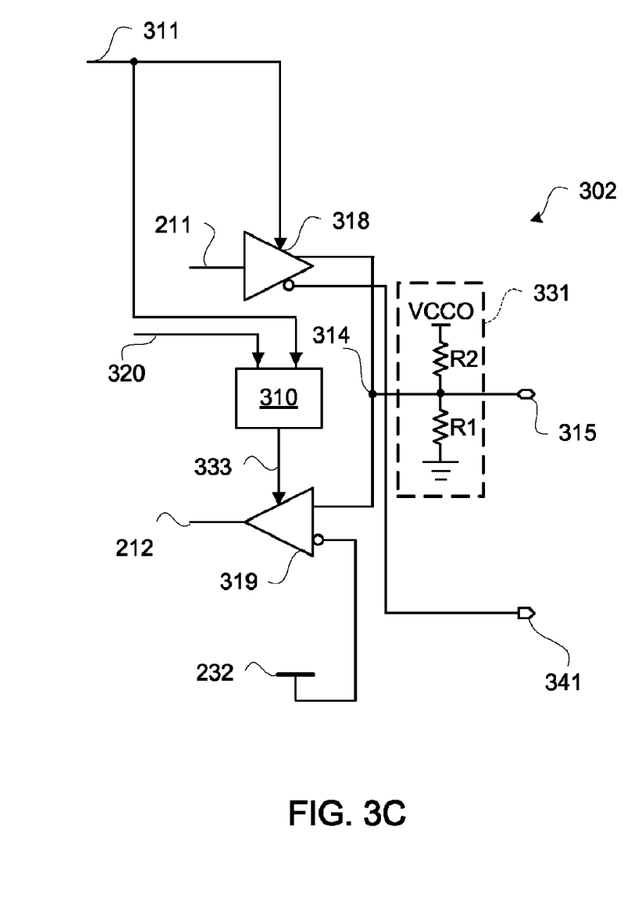

FIG. 3C is a block/circuit diagram depicting an exemplary embodiment of an IOB 302 with a differential tri-state output buffer 318 replacing output buffer 308 and with a differential tri-state input buffer 319 replacing input buffer 309, as in FIG. 3B. However, rather than a true differential signal configuration, a reference voltage configuration is used for input to input buffer 319. More particularly, a negative-side input of input buffer 319 is coupled to a reference voltage source 232. Thus, common I/O node 317 is omitted, and a negative-side output of differential tri-state output buffer 318 is coupled to output pad 341. Furthermore, optional programmable termination impedance circuit 332 is omitted, as it is not used in a send mode of output buffer 318.

So, even though IOB 302 is described hereinbelow for single-ended signaling with reference to FIG. 3A for purposes of clarity and not limitation, it should be understood that IOB 302 as described herein may be modified for differential signaling as described with reference to FIGS. 3B and 3C.

Programmable termination impedance circuit 330 is illustratively depicted as a resistor R2 coupled between common I/O node 314 and a supply voltage VCCO and a resistor R1 coupled between common I/O node 314 and ground. However, this is just a model diagram of a pull-up resistance/pull-down resistance circuit. It should, however, be understood that programmable termination impedance circuit 330 may be implemented with transistors and/or resistors. Generally, any programmable termination resistance circuits may be used. For example, a digitally controlled impedance circuit as described in U.S. Pat. Nos. 6,445,245 and 6,489,837 may be used for programmable termination impedance circuit 330.

In a send mode, data input to output buffer 308 may be provided as output from output buffer 308 to common I/O node 314. Such data may thus be provided from common I/O node 314 to I/O pad 315. In a send mode, programmable termination impedance circuit 330 may be disabled as described below in additional detail, as source termination from IOB 302 may not be used during a send mode. During a send mode, tri-state output signal 311 is de-asserted. A de-asserted tri-state signal provided to output buffer 308 takes or transitions output buffer 308 out of a tri-state condition or mode, thus allowing output buffer 308 to drive output for sending data.

During a send mode, de-assertion of tri-state output 311 causes control circuit 310 to assert a tri-state signal 333 to tri-state input buffer 309. More particularly, control circuit 310 is configured to assert a tri-state signal 333 provided to a control port of input buffer 309 responsive to de-assertion of tri-state output signal 311. Thus, in a send mode, input buffer 309, whether single-ended or differential, is placed or transitioned into a tri-state mode or condition, namely tri-stated.

In a receive mode, tri-state output 311 is asserted, and thus output buffer 308 is put in or transitioned into a tri-state condition, namely "tri-stated." Control circuit 310 responsive to assertion of tri-state output signal 311 is configured to de-assert tri-state signal 333 as provided to tri-state input buffer 309. In a receive mode, programmable termination impedance circuit 330 may be active for providing a termination impedance. Accordingly, data received at I/O pad 315 may be provided to common I/O node 314 for input to input buffer 309, and output of such data from input buffer 309 is provided as input data to I/O delay 303.

It should be appreciated that control circuit 310 is configured to have opposite states with respect to tri-state output signal 311 and tri-state signal 333. Thus, tri-state output signal 311 provided to a control port of output buffer 308 causes output buffer 308 to be tri-stated during a receive mode, and tri-state signal 333 inversely responsive to tri-state output 311 is asserted by control circuit 310 as provided to a control port of input buffer 309 during a receive mode for transitioning or removing input buffer 309 out of a tri-state mode for operation as an input driver. Conversely, in a send mode, tri-state output 311 is de-asserted and thus output buffer 308 is taken out of a tri-state state for operating as an output driver, and input buffer 309 is put into a tri-state condition responsive to assertion of tri-state signal 333. Common I/O node 314 is coupled to an output of output buffer 308 and to an input of input buffer 309 for such bi-directional operation In the above described embodiment, control circuit 310 may be implemented as an inverter. However, control circuit 310 may further receive an input buffer disable signal 320. Input buffer disable signal 320 may be invoked by setting an attribute which is user selectable. Accordingly, assuming input buffer disable signal 320 is present, control circuit 310 may be implemented with an OR gate and an inverter, where input obtained from tri-state output 311 is inverted for input to an OR gate and another input to such OR gate is input buffer disable signal 320. However, it should be appreciated from the following description that any of variety of circuit implementations for control circuit 310 may be used in accordance with the description herein. Furthermore, it should be understood that even though tri-state signal 333 provided as a control signal to input buffer 309 may generally be thought of as a input buffer disable signal as described herein, equivalently tri-state signal 333 may be thought of as an enable signal.

Figure 4:
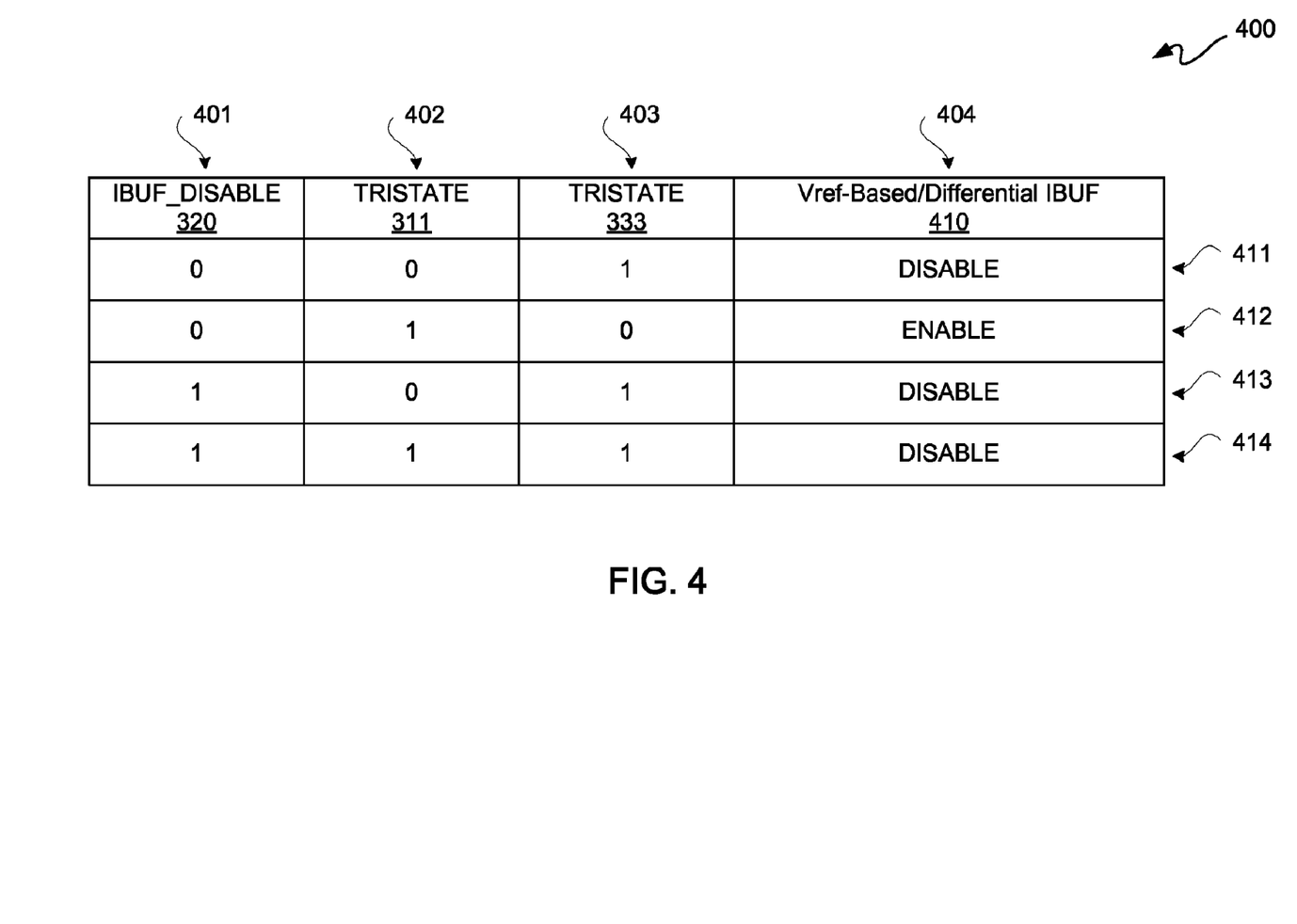
FIG. 4 is a table diagram depicting an exemplary embodiment of a truth table for an IOB of FIG. 3C used in the I/O system of FIG. 3A.

FIG. 4 is a table diagram depicting an exemplary embodiment of a truth table 400. With simultaneous reference to FIGS. 3 and 4, truth table 400 is further described.

Truth table 400 includes a column 401 associated with state of input buffer disable signal 320, a column 402 associated with state of tri-state output signal 311, and a column 403 associated with tri-state signal 333. From states in columns 401 and 403, status of an input buffer 309 may be determined as indicated in column 404. Even though status of an input buffer as indicated in column 404 may be for any of the input buffers of FIGS. 3A through 3C, it shall be assumed that operation of input buffer 319 of FIG. 3C is being described for purposes of clarity by way of example and not limitation. Accordingly, a reference voltage base/differential input buffer status 410 is indicated in column 404.

For row 411, input buffer disable signal 320 is not asserted, namely is a logic low state. In row 411, tri-state output signal 311 is logic 0; and tri-state signal 333 is logic 1. For this exemplary embodiment, de-assertion of a signal is logic low or 0, and assertion of a signal is logic high or 1. De-assertion of tri-state output signal 311 is for a send mode, and thus tri-state signal 333 is asserted. Assertion of tri-state signal 333 causes input buffer 319 to be tri-stated.

For row 412, input buffer disable signal 320 is not asserted; however, tri-state output signal 311 is asserted. Assertion of tri-state output signal 311 means that tri-state signal 333 is de-asserted as indicated by a logic 0. Accordingly, in a receive mode, tri-state output signal 311 is asserted and tri-state signal 333 is de-asserted, so input buffer 319 is used as an input driver, which in this example is a voltage reference based differential driver, as generally indicated by an enable in column 404 at row 412.

For rows 413 and 414, input buffer disable signal 320 is a logic 1, namely asserted. Input buffer disable signal 320 is an override signal. By override signal, it means that it does not matter the state of control signals 311 and 333, as input buffer disable signal 320 when asserted disables input buffer 319, namely tri-states input buffer 319. Thus, in row 414, even though tri-state signal 311 is asserted, an input buffer is indicated as being disabled in column 404. Thus, regardless of the state of tri-state output signal 311, which otherwise controls the state of tri-state signal 333, assertion of input buffer disable signal 320 causes assertion of tri-state signal 333. More particularly, control circuit 310 is configured to assert tri-state signal 333 responsive to input buffer disable signal 320 regardless of the state of tri-state output signal 311.

Even though a reference voltage-based differential input buffer was described for Table 400, it should be understood that such description equally applies to a true differential input buffer configuration and a single-ended input buffer.

Figure 5:
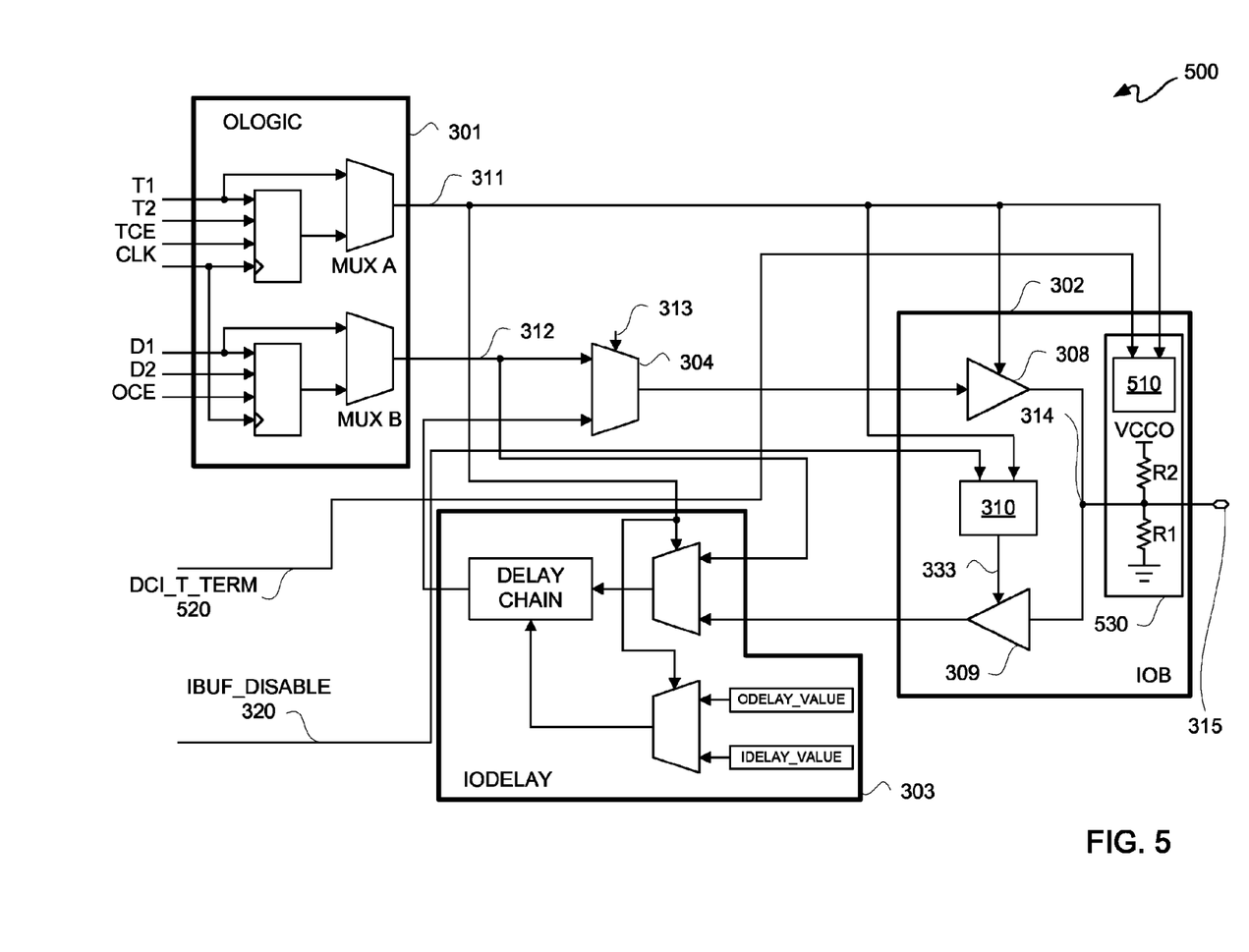
FIG. 5 is a block/circuit diagram depicting an exemplary embodiment of another I/O system.

FIG. 5 is a block/circuit diagram depicting an exemplary embodiment of an I/O system 500. I/O system 500 is similar to I/O system 300 of FIG. 3A, and thus only the differences are described herein for purposes of clarity and not limitation.

It should be understood that even though IOB 302 of FIG. 3A as modified in FIG. 5 is described, IOBs 302 of FIGS. 3B and 3C may be used with programmable termination impedance circuits 331 and 332 thereof modified as in FIG. 5 with associated input signals as described herein.

Programmable termination impedance circuit 530 of IOB 302 replaces optional programmable termination impedance circuit 330 of FIG. 3A. A control circuit 510 has been coupled into optional programmable termination impedance circuit 330 of FIG. 3A in order to provide programmable termination impedance circuit 530. Control circuit 510 is coupled to receive a disable signal, namely digitally control impedance ("DCI") tri-state termination ("DCI_T_TERM") signal 520. Furthermore, control circuit 510 receives tri-state output signal 311.

Control circuit 510 is configured to tri-state or otherwise disable or deactivate programmable termination impedance circuit 530 when IOB is in a send mode responsive to tri-state output signal 311 being de-asserted. Control circuit 510 is further configured to activate programmable termination impedance circuit 530 when IOB is in a receive mode responsive to tri-state output signal 311 being asserted. Furthermore, control circuit 510 is configured to tri-state or otherwise disable programmable termination impedance circuit 530 when a bus coupled thereto is idle responsive to assertion of DCI tri-state termination signal 520.

For example, one or more transistors may be coupled as pass gates between a power and/or ground bus and other circuitry of programmable termination impedance circuit 530. Output from control logic of control circuit 510 may be used to gate such one or more pass gates for selective activation and deactivation of programmable termination impedance circuit 530. However, this or other circuitry implementations for control circuit 510 may be used, as should be understood from the description herein. Furthermore, it should be understood that programmable termination impedance circuit 530 may, though need not be, in an IOB 302 with control circuit 310. Thus, for example, in an embodiment, control circuit 310 may be omitted and an input buffer of such IOB need not be a tri-state input buffer. However, for purposes of clarity and not limitation, it shall be assumed that control circuit 510 and control circuit 310 are both present in an IOB 302.

Figure 6:
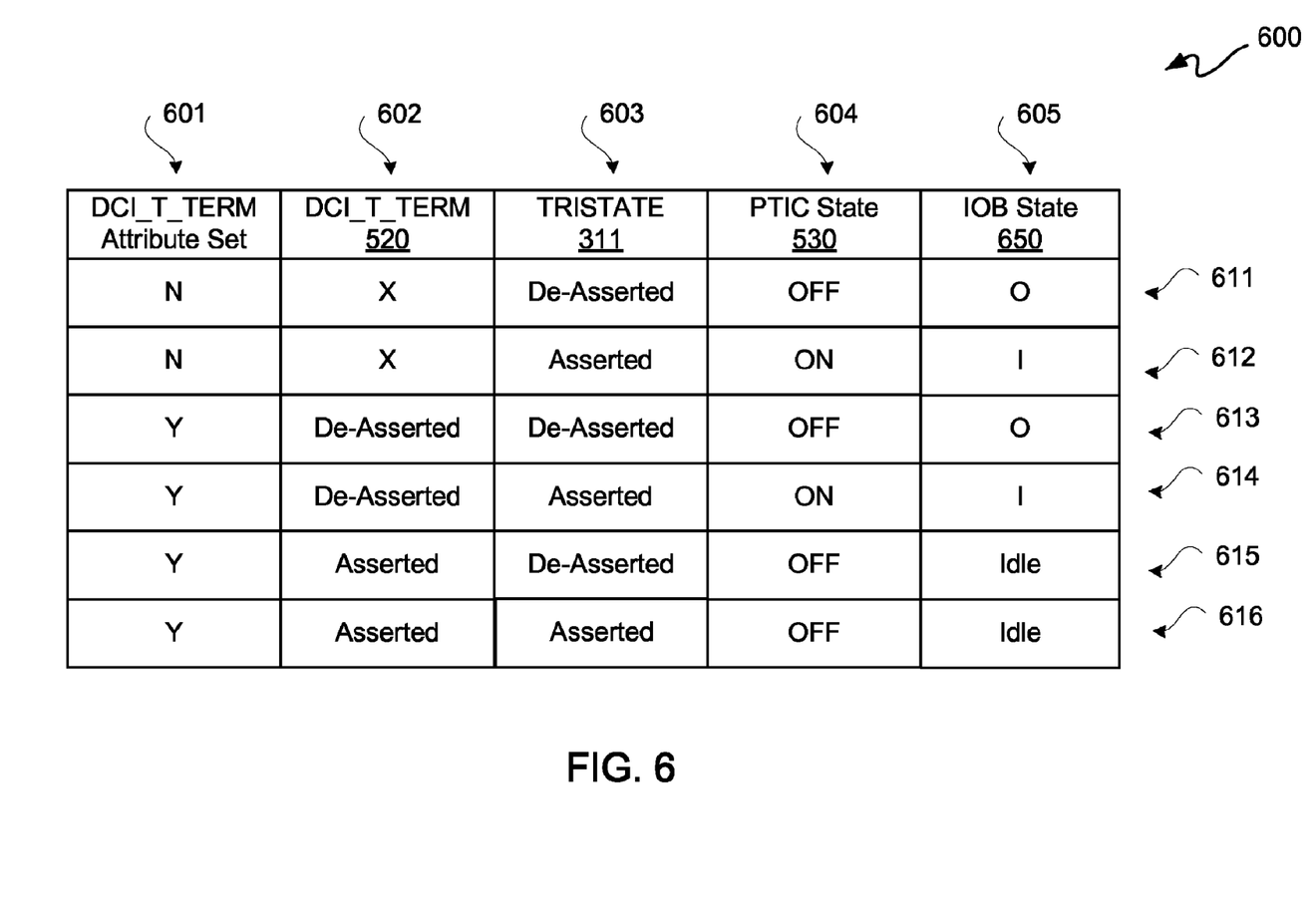
FIG. 6 is a table diagram depicting an exemplary embodiment of a truth table for a programmable termination impedance circuit used in the I/O system of FIG. 5.

FIG. 6 is a table diagram depicting an exemplary embodiment of a truth table 600. Truth table 600 is for operation of IOB 302 of FIG. 5. Truth table 600 is further described with simultaneous reference to FIGS. 5 and 6.

Column 601 is to indicate whether an attribute for DCI tri-state termination signal 520 has been set. Column 602 is to indicate state of DCI tri-state termination signal 520. Column 603 is to indicate state of tri-state output signal 311. Column 604 is to indicate state of programmable termination impedance circuit 530. Lastly, column 605 is to indicate whether an input mode ("I") or an output mode ("O") is the invoked mode or state 650 of IOB 302.

Row 611 indicates that a DCI tri-state termination attribute is not set as indicated by "N". Accordingly, an associated DCI tri-state termination signal 520 is a "don't care" as indicated with an "X". For row 611, tri-state output signal 311 is de-asserted and accordingly, programmable termination impedance circuit 530 is disabled or off as IOB 302 is in an output mode.

For row 612, DCI tri-state termination attribute is not set, and thus DCI tri-state termination signal 520 is a "don't care" condition. For row 612, tri-state output signal 311 is asserted, and accordingly programmable termination impedance circuit 530 is activated or on as IOB 302 is in an input mode.

For rows 613 through 616, the DCI tri-state termination attribute is set as indicated in column by a "Y". For rows 613 and 614, DCI tri-state termination signal 520 is de-asserted. For row 613, tri-state output signal 311 is de-asserted, and thus programmable termination impedance circuit 530 is off as IOB 302 is in an output state. For row 614, tri-state output signal 311 is asserted, and thus programmable termination impedance circuit 530 is on, as IOB 302 is in an input state.

For rows 615 and 616, DCI tri-state termination signal 520 is asserted. DCI tri-state termination signal 520 is an override signal. As an override signal, DCI tri-state termination signal 520 may be used when an idle bus state is present. Thus it does not matter whether tri-state output signal 311 is de-asserted as indicated in row 615 or asserted as indicated in row 616, as programmable termination impedance circuit 530 will be off, as indicated in rows 615 and 616, respectively, for an idle state of a bus coupled to IOB 302.

Figure 7A:
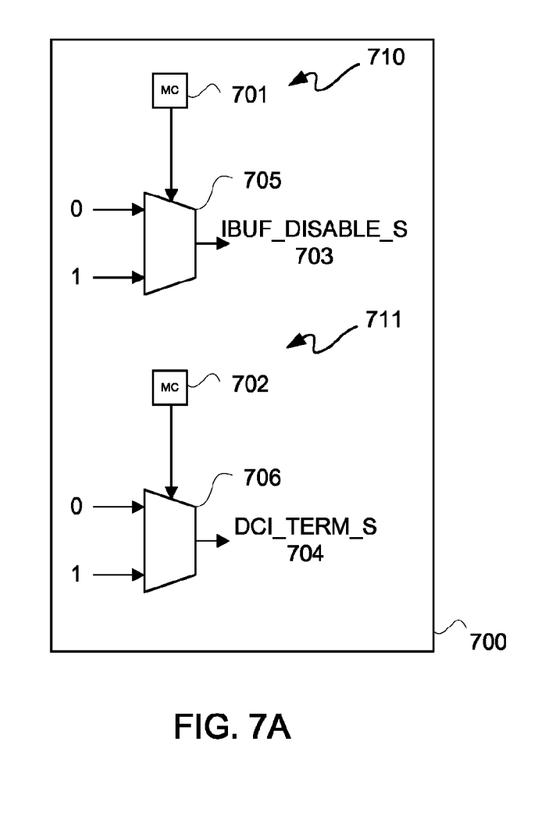
FIG. 7A is a block/circuit diagram depicting an exemplary embodiment of control circuitry.

FIG. 7A is a block/circuit diagram depicting an exemplary embodiment of control circuitry 700. Control circuitry 700 may be instantiated in programmable resources, such as of FPGA 100 of FIG. 1 for example. Control circuitry 700 may include settings for both input buffer disable signal 320 and DCI tri-state termination signal 520. Control circuitry 700 includes input buffer disable attribute circuit 710 and programmable termination impedance attribute circuit 711.

Generally, circuit 710 may include a multiplexer 705 coupled to receive a logic 0 and a logic 1 as inputs. A control select signal provided to multiplexer 705 may be provided from a configuration memory cell 701. Multiplexer 705 may have its two inputs tied, namely one tied to a logic 0 and another tied to a logic 1, for selectively providing input buffer disable status signal 703. If such memory cell 701 is not set, then output of multiplexer 705 for input buffer disable status signal 703 may be a logic 0, meaning that input buffer disable signal 320 does not have an attribute set therefor, and thus is always de-asserted.

If, however, configuration memory cell 701 does have a logic bit set therefor to indicate that the input buffer disable attribute is set, then output of multiplexer 705 may be a logic 1 for providing input buffer disable status signal 703. Thus, responsive to other control circuitry not shown, input buffer disable signal 320 may or may not be asserted.

It should be understood that just because an attribute is set for providing a signal, does not necessarily mean that such signal is always asserted. For example, control logic may be used to assert input buffer disable signal 320 only when input buffer disable status signal 703 is a logic 1 and an off bus condition is detected. This and other examples of when to assert input buffer disable signal 320 may vary from application-to-application, and thus circuitry therefor may vary.

Circuit 711 includes multiplexer 706 and memory cell 702. Configuration memory cell 702 may be set for setting a DCI tri-state termination attribute. A control select signal provided to multiplexer 706 may be provided from configuration memory cell 702. Multiplexer 706 may have its two inputs tied, namely one tied to a logic 0 and another tied to a logic 1, for selectively providing DCI tri-state termination status signal 704.

If such DCI tri-state termination attribute is not set in memory cell 702, then output of multiplexer 706 may be a logic 0. If, however, an attribute is set in configuration memory cell 702 for DCI tri-state termination signal 520, then output of multiplexer 706 may be a logic 1 for providing DCI tri-state termination status signal 704. Thus, responsive to other control circuitry not shown, DCI tri-state termination signal 520 may or may not be asserted.

Again, it should be understood that just because an attribute is set for providing a signal, does not necessarily mean that such signal is always asserted. For example, control logic may be used to assert DCI tri-state termination signal 520 only when DCI tri-state termination status signal 704 is a logic 1 and an off bus condition is detected. This and other examples of when to assert DCI tri-state termination signal 520 may vary from application-to-application, and thus circuitry therefor may vary.

Figure 7B:
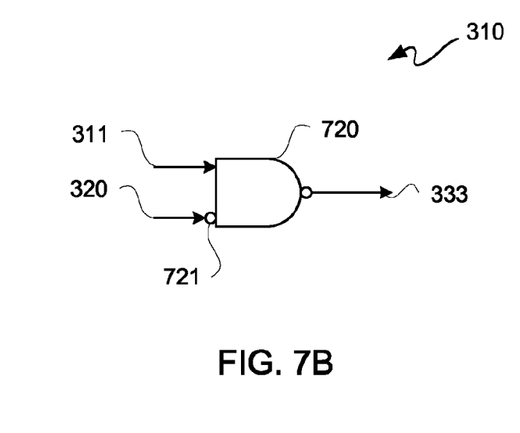
FIG. 7B is a circuit diagram depicting an exemplary embodiment of a control circuit for an IOB of FIGS. 3A, 3B, 3C, and 5.

FIG. 7B is a circuit diagram depicting an exemplary embodiment of a control circuit 310, such as for IOBs 302 of FIGS. 3A, 3B, 3C, and 5. A NAND gate 720 is coupled to receive tri-state output signal 311. In another embodiment, NAND gate 720 may be replaced with an AND gate; however, output of such AND gate would be an input buffer enable signal. Thus, for purposes of clarity and not limitation, tri-state signal 333 output from control circuit 310, of FIG. 3A for example, may generally be thought of as a disable signal even though in another embodiment such signal may be generally considered an enable signal. An inverter 721 is coupled to receive input buffer disable signal 320. Output of inverter 721 is provided as another input to NAND gate 720. When input buffer disable signal 320 is logic 0, NAND gate 720 acts as an inverter, so tri-state signal 333 output from NAND gate 720 is the inverse of tri-state output signal 311. When input buffer disable signal 320 is logic 1, output of inverter 721 is logic 0. Output of a logic 0 from inverter 721 thus causes output of NAND gate 720 to be a logic 1.

Figure 7C:
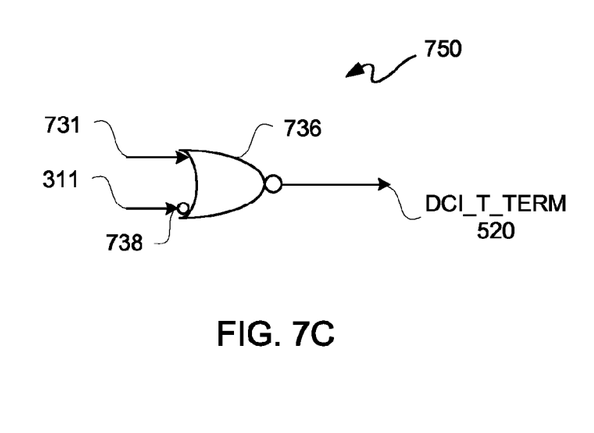
FIG. 7C is a circuit diagram depicting an exemplary embodiment of a control circuit for an IOB of FIG. 5.

FIG. 7C is a circuit diagram depicting an exemplary embodiment of a control circuit 750. Control circuit 750 includes inverter 738 and NOR gate 736. Tri-state output signal 311 is provided as an input to an inverter 738. Output of inverter 738 is provided as an input to NOR gate 736. Another input to NOR gate 736 is dynamic DCI termination signal 731. Dynamic DCI termination signal 731 may be generated by control logic (not shown) responsive to whether or not an off bus or other condition is present. Output of NOR gate 736 is DCI tri-state termination signal 520. It should be appreciated that any of a number of circuits may be used for providing control circuit 510 of FIG. 5 for tri-stating a programmable termination impedance circuit, and thus such circuits are not described for purposes of clarity.

When dynamic DCI termination signal 731 is logic 0, the combination of inverter 738 and NOR gate 736 acts as an inverter of tri-state output signal 311 for providing DCI tri-state termination signal 520. When DCI termination signal 731 is logic 1, output of NOR gate 736 is a logic 0 for providing DCI tri-state termination signal 520.

Figure 8:
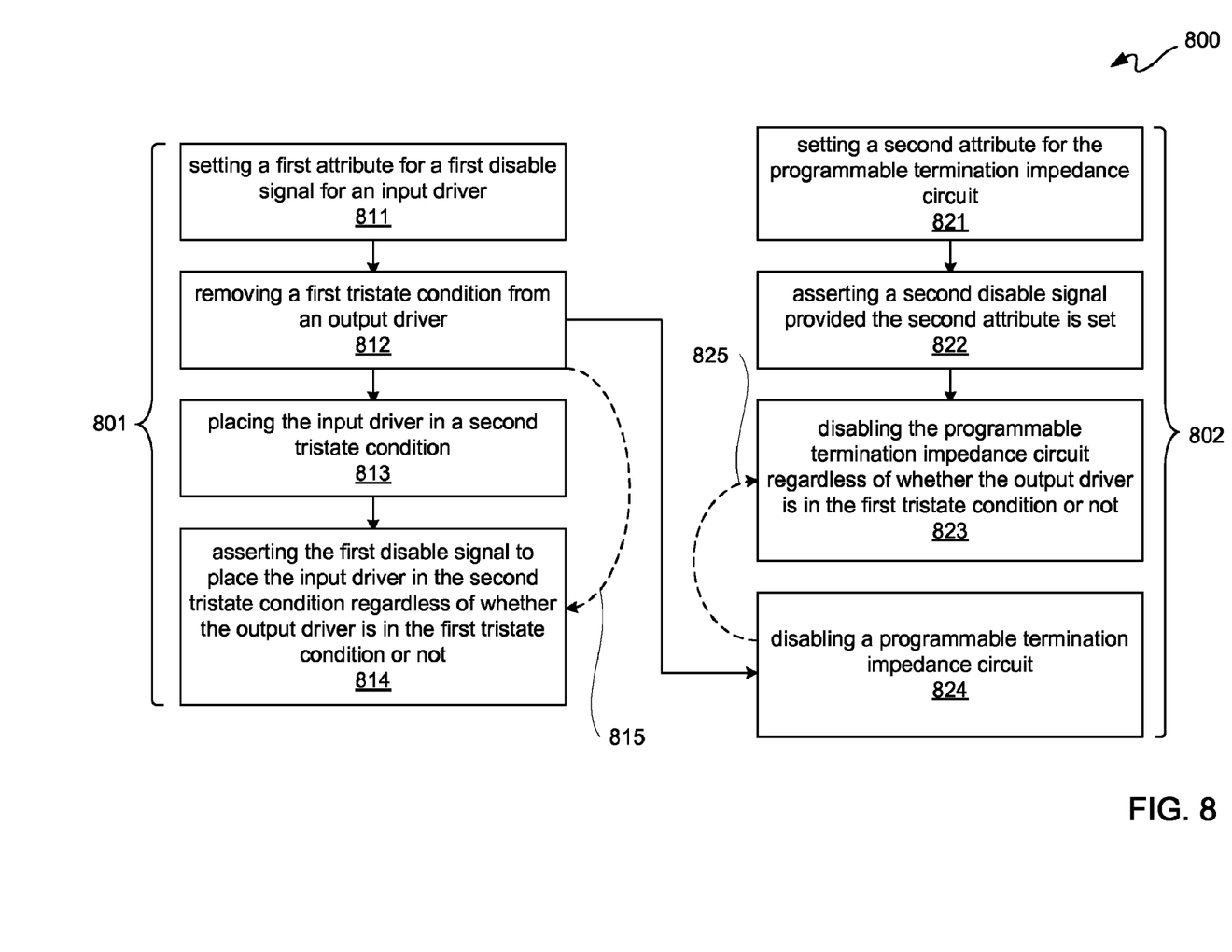
FIG. 8 is a flow diagram depicting an exemplary embodiment of an I/O block operational flow.

FIG. 8 is a flow diagram depicting an exemplary embodiment of an I/O block operational flow 800. Portion 801 of flow 800 is associated with operation of an input buffer, as previously described herein, and portion 802 of flow 800 is associated with operation of a programmable termination impedance circuit, as previously described herein.

At 811, a first attribute for a first disable signal is set for an input driver. Such attribute may be set by a user by programming a configuration memory cell, as previously described. At 812, a first tri-state condition is removed from an output driver. Removing such output driver tri-state condition is for a send mode. Responsive to removing such first tri-state condition from output driver 812, a programmable termination impedance circuit may be disabled at 824.

Responsive to the removing of the first tri-state condition from an output driver at 812, at 813 an input driver is placed in a second tri-state condition. Such second tri-state condition is for disabling such input driver so as to reduce power consumption thereof during a send mode as initiated at 812. It should be understood that the terms first and second as used herein are merely for purposes of clarity so as to distinguish tri-state conditions; however, it should be appreciated that an output driver and an input driver each only have one tri-state condition in which they may be placed.

Furthermore, responsive to the removing of the first tri-state condition from an output driver at 812, a programmable termination impedance circuit may be disabled at 824. Thus, in a send mode, such programmable termination impedance circuit may be disabled to conserve power.

At 814, the first disable signal is asserted to place the input driver in the second tri-state condition. It should be understood that this is an override signal at 814, because the input driver is placed in the second tri-state condition regardless of whether the output driver is in the first tri-state condition or not as generally indicated by dashed line 815. It should be understood that the first disable signal is associated with disabling an input buffer. It should further be understood that such first disable signal may be provided from control logic instantiated in programmable resources, as previously described herein, for example when a bus associated with such input driver is idle.

Portion 802 may be operated in parallel with portion 801. At 821, a second attribute for the programmable termination impedance circuit is set. Again, the terms "first" and "second" are merely so as to distinguish attributes as between an input buffer and a programmable termination impedance circuit. Such a termination impedance circuit and such input buffer circuit may each only have one attribute which may or may not be set.

At 822, a second disable signal is asserted provided that the second attribute for the programmable termination impedance circuit is set at 821. If such attribute is not set, such second disable signal may not be available to be asserted at 822. Likewise, asserting such first disable signal at 814 may be conditioned upon the setting of a first attribute at 811. If such attribute is not set, then such disable signal may not be available.

Such first and second disable signals may be provided from control circuitry instantiated into programmable resources, as previously described herein. Furthermore, it should be understood that rather than programmable resources, dedicated resources may be used. Additionally, it should be appreciated that such disable signals may be provided to more than one input buffer, even though only one input buffer is described with reference to FIG. 8 for purposes of clarity and not limitation. In other words, it should be understood that multiple IOBs 302 may be used as IOBs 104 of FPGA 100 of FIG. 1 to provide an interface. Such IOBs 302 of such interface may each receive the first and second disable signals from a same control circuit block.

At 823, the programmable termination circuit is disabled responsive to assertion of the second disable signal at 822. It should be understood that at 823, because the second disable signal is an override signal, the programmable termination impedance circuit is disabled regardless of whether the output driver is in the first tri-state condition or not, namely regardless as to whether operation at 824 transpired or not, as generally indicated by dashed line 825.

It should be understood that there are many types of signaling specifications that may be used with input buffers. For example, LVTTL and LVCMOS are signaling protocols that have selectable drive and slew rates. Such I/O protocols involve following a set of usage rules for operation of I/O buffers. It should be understood that IOB 302 as described herein may be used with any of a variety of I/O protocols including without limitation HSTL, LVDS, LVCMOS, LVPECL, PCI, SSTL, GTL, LVTTL, and AGP, among others.

Figure 9:
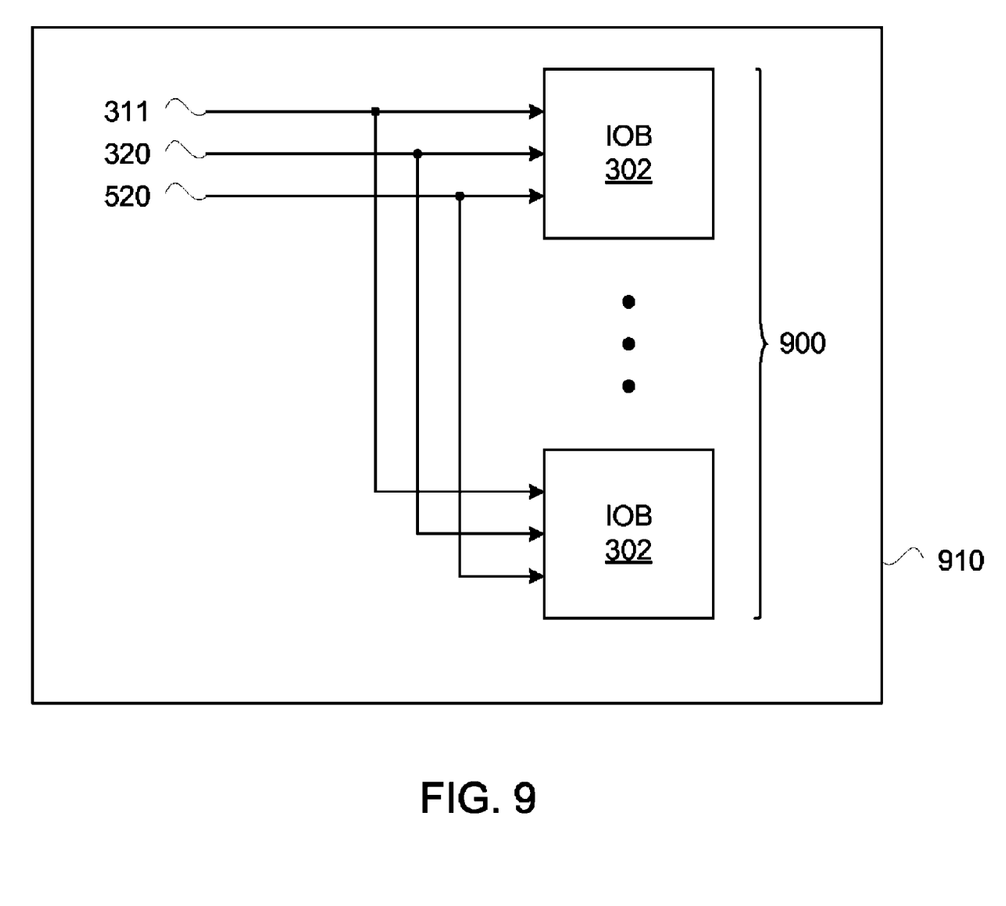
FIG. 9 is a block diagram depicting an exemplary embodiment of an interface 900 of an integrated circuit ("IC").

FIG. 9 is a block diagram depicting an exemplary embodiment of an interface 900 of an IC 910. IC 910 may be any IC having multiple IOBs 302 for providing an interface 900.

IOBs 302 are coupled to receive a common tri-state output signal 311. IOBs 302 may be coupled to receive a common input buffer disable signal 320. IOBs 302 may be coupled to receive a common DCI tri-state termination signal 520. Thus, it should be appreciated that multiple IOBs 302 may be commonly controlled with respect to one or more of signals 311, 320, and 520. For example, all of IOBs 302 may have their input buffers 309 of FIGS. 3A, 3B, 3C, and 5 disabled or tri-stated responsive to assertion of input buffer disable signal 320 or tri-state output signal 311, as previously described. Furthermore, all of IOBs 302 may have their programmable termination impedance circuits 530 of FIG. 5 disabled or tri-stated responsive to assertion of DCI tri-state termination signal 520, as previously described.

While the foregoing describes exemplary embodiments in accordance with one or more aspects of the invention, other and further embodiments in accordance with the one or more aspects of the invention may be devised without departing from the scope thereof, which is determined by the claims that follow and equivalents thereof. Claims listing steps do not imply any order of the steps. Trademarks are the property of their respective owners.

What is claimed is:

1. A system, comprising:
    a plurality of input/output blocks, wherein each of the plurality of input/output blocks includes:
        an output driver having a first control port for receiving a first tri-state signal;
        an input driver having a second control port;
        control circuitry coupled to receive the first tri-state signal and coupled to the second control port;
        wherein the control circuitry provides a second tri-state signal responsive to control signaling;
        wherein the input driver is coupled to receive the second tri-state signal; and
        a first input/output node commonly coupled to an output port of the output driver and a first input port of the input driver;
        wherein responsive to the control signaling, which includes the first tri-state signal and the second tri-state signal, the output driver is de-activated during a receive mode and activated during a send mode, and the input driver is activated during the receive mode and de-activated during the send mode;
        wherein the control circuitry of each of the plurality of input/output blocks coupled to receive a disable signal.

2. The system according to claim 1, wherein the input driver is a tri-state buffer; and wherein the output driver is another tri-state buffer.

3. The system according to claim 1, further comprising:
    a second input/output node coupled to a second input port of the input driver;
    wherein the input driver is a differential tri-state buffer.

4. The system according to claim 1, further comprising:
    a second input port of the input driver coupled to a reference voltage source;
    wherein the input driver is a differential tri-state buffer.

5. The system according to claim 1, wherein:
    the output driver is transitioned into the send mode responsive to de-assertion of the first tri-state signal and transitioned out of the send mode responsive to assertion of the first tri-state signal;
    the control circuitry asserts the second tri-state signal responsive to de-assertion of the first tri-state signal and de-asserts the second tri-state signal responsive to assertion of the first tri-state signal;
    the input driver is transitioned into the receive mode responsive to de-assertion of the second tri-state signal and transitioned out of the receive mode responsive to assertion of the second tri-state signal; and
    the control circuitry further asserts the second tri-state signal responsive to assertion of the disable signal regardless of state of the first tri-state signal.

6. The system according to claim 1, wherein:
    the control circuitry asserts the second tri-state signal responsive to assertion of the disable signal regardless of state of the first tri-state signal; and
    assertion of the disable signal causes the input driver of each of the plurality of input/output blocks to be tri-stated.

7. The system according to claim 6, further comprising:
    a second input/output node of each of the plurality of input/output block is respectively coupled to a second input port of the input driver of each of the plurality of input/output blocks;
    wherein the input driver of each of the plurality of input/output blocks is a differential tri-state buffer.

8. The input/output block according to claim 6, further comprising:
    a second input port of the input driver of each of the plurality of input/output blocks coupled to a reference voltage source;
    wherein the input driver of each of the plurality of input/output blocks is a differential tri-state buffer.

9. A system, comprising:
    a plurality of input/output blocks, wherein each of the plurality of input/output blocks includes:
        an output driver having a first control port for receiving a first tri-state signal;
        an input driver;
        a first input/output node commonly coupled to an output port of the output driver and a first input port of the input driver;
        a programmable termination impedance circuit coupled to the first input/output node;
        the programmable termination impedance circuit including first control circuitry coupled to receive the first tri-state signal and a first disable signal; and
        the first control circuitry configured to:
            activate the programmable termination impedance circuit for a receive mode responsive to the first tri-state signal; and
            deactivate the programmable termination impedance circuit for a send mode and an idle state respectively responsive to the first tri-state signal and the first disable signal;
    second control circuitry having state storage for setting at least one attribute for determining whether to assert or de-assert the first disable signal; and
    the second control circuitry coupled to the first control circuitry of each of the plurality of input/output blocks for providing the first disable signal to the first control circuitry of each of the plurality of input/output blocks.

10. The system according to claim 9, wherein:

the input driver has a second control port; and the input driver and the output driver are each a tri-state buffer.

11. The system according to claim 10, further comprising:

third control circuitry coupled to receive the first tri-state signal and coupled to the second control port;

the third control circuitry configured to provide a second tri-state signal responsive to control signaling;

the input driver coupled to receive the second tri-state signal; and the third control circuitry further coupled to receive a second disable signal as part of the control signaling;

wherein responsive to the control signaling, which includes the first tri-state signal, the second tri-state signal, and the second disable signal:

the output driver is de-activated during the receive mode and activated during the send mode;

the input driver is activated during the receive mode and de-activated during the send mode; and the output driver and the input driver are both de-activated during an idle state.

12. A method for operation of a system including a plurality of input/output blocks, comprising:

setting a first attribute for a first disable signal;

inputting the first disable signal to the plurality of input/output blocks, each input/output block having an input driver and an output driver;

removing a first tri-state condition from the output drivers of the plurality of input/output blocks; and responsive to the removing, placing the input drivers of the plurality of input/output blocks in a second tri-state condition;

placing the output drivers of the plurality of input/output blocks in the first tri-state condition;

responsive to the placing, removing the input drivers of the plurality of input/output blocks from the second tri-state condition; and asserting the first disable signal to place the input drivers of the plurality of input/output blocks in the second tri-state condition regardless of whether or not the output drivers of the plurality of input/output blocks are in the first tri-state condition.

13. The method according to claim 12, wherein each of the input/output blocks further includes a programmable termination impedance circuit coupled to the input driver and output driver of the input/output block, the method further comprising:

disabling the programmable termination impedance circuits of the plurality of input/output blocks responsive to the removing of the first tri-state condition from the output drivers of the plurality of input/output blocks.

14. The method according to claim 13, further comprising:

setting a second attribute for the programmable termination impedance circuits;

asserting a second disable signal responsive to a bus idle state; and responsive to the asserting of the second disable signal, disabling the programmable termination impedance circuits of the plurality of input/output blocks regardless of whether or not the output drivers of the plurality of input/output blocks are in the first tri-state condition.

15. A method for operation of a system including a plurality of input/output blocks, comprising:

removing a first tri-state condition from the output drivers of the plurality of input/output blocks; and responsive to the removing, placing the programmable termination impedance circuits of the plurality of input/output blocks in a second tri-state condition;

setting an attribute for a disable signal;

asserting the disable signal responsive to a bus idle state; and responsive to the asserting of the disable signal, disabling the programmable termination impedance circuits of the plurality of input/output blocks regardless of whether or not the output drivers are in the first tri-state condition.

* * * * *